US012568820B2

(12) United States Patent
Lin et al.

(10) Patent No.: US 12,568,820 B2
(45) Date of Patent: Mar. 3, 2026

(54) SEMICONDUCTOR PACKAGE INCLUDING LID WITH INTEGRATED HEAT PIPE FOR THERMAL MANAGEMENT AND METHODS FOR FORMING THE SAME

(71) Applicant: Taiwan Semiconductor Manufacturing Company Limited, Hsinchu (TW)

(72) Inventors: Yu-Sheng Lin, Zhubei (TW); Shu-Shen Yeh, Hsinchu (TW); Chin-Hua Wang, New Taipei City (TW); Po-Yao Lin, Zhudong Township (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 73 days.

(21) Appl. No.: 18/366,788

(22) Filed: Aug. 8, 2023

(65) Prior Publication Data

US 2023/0386960 A1    Nov. 30, 2023

Related U.S. Application Data

(62) Division of application No. 17/407,224, filed on Aug. 20, 2021, now Pat. No. 12,009,276.

(51) Int. Cl.
H01L 21/56         (2006.01)
H01L 21/52         (2006.01)
(Continued)

(52) U.S. Cl.
CPC .......... H01L 23/3672 (2013.01); H01L 21/52 (2013.01); H01L 23/053 (2013.01);
(Continued)

(58) Field of Classification Search
CPC ....... H01L 21/52; H01L 23/053; H01L 23/04; H01L 23/3672; H01L 23/3736;
(Continued)

(56) References Cited

U.S. PATENT DOCUMENTS 10,096,537 B1 * 10/2018 Chen ................... H01L 23/4336
2015/0108628 A1 * 4/2015 Yu ....................... H01L 23/3675
                                                        257/712

(Continued)

FOREIGN PATENT DOCUMENTS

CN        208674099 U       3/2019
TW        201802992 A       1/2018

OTHER PUBLICATIONS

TW Patent and Trademark Office; TW Application No. 111128107; Office Action mailed Sep. 15, 2025; 12 pages.

*Primary Examiner* — Omar F Mojaddedi
(74) *Attorney, Agent, or Firm* — The Marbury Law Group, PLLC

(57)                    ABSTRACT

A semiconductor package including a lid having one or more heat pipes located on and/or within the lid to provide improved thermal management. A lid for a semiconductor package having one or more heat pipes thermally integrated with the lid may provide more uniform heat loss from the semiconductor package, reduce the risk of damage to the package due to excessive heat accumulation, and may enable the lid to be fabricated using less expensive materials, thereby reducing the costs of a semiconductor package.

20 Claims, 8 Drawing Sheets

(51) Int. Cl.

| | |
|---|---|
| *H01L 23/053* | (2006.01) |
| *H01L 23/367* | (2006.01) |
| *H01L 23/373* | (2006.01) |
| *H01L 23/427* | (2006.01) |
| *H01L 23/498* | (2006.01) |
| *H01L 25/18* | (2023.01) |

(52) U.S. Cl.
CPC ........ *H01L 23/3736* (2013.01); *H01L 23/427* (2013.01); *H01L 23/49833* (2013.01); *H01L 25/18* (2013.01)

(58) Field of Classification Search
CPC . H01L 23/427; H01L 23/49833; H01L 23/36; H01L 23/42; H01L 25/18; H01L 25/0652; H01L 25/0655
See application file for complete search history.

(56) References Cited

U.S. PATENT DOCUMENTS

| | | | | |
|---|---|---|---|---|
| 2015/0162307 | A1* | 6/2015 | Chen | H01L 21/56 |
| | | | | 438/107 |
| 2020/0051894 | A1* | 2/2020 | Wan | H01L 23/427 |
| 2020/0083143 | A1* | 3/2020 | Tsai | H01L 24/16 |
| 2020/0273777 | A1* | 8/2020 | Jain | H01L 21/565 |
| 2020/0350231 | A1* | 11/2020 | Shen | H01L 23/4334 |

* cited by examiner

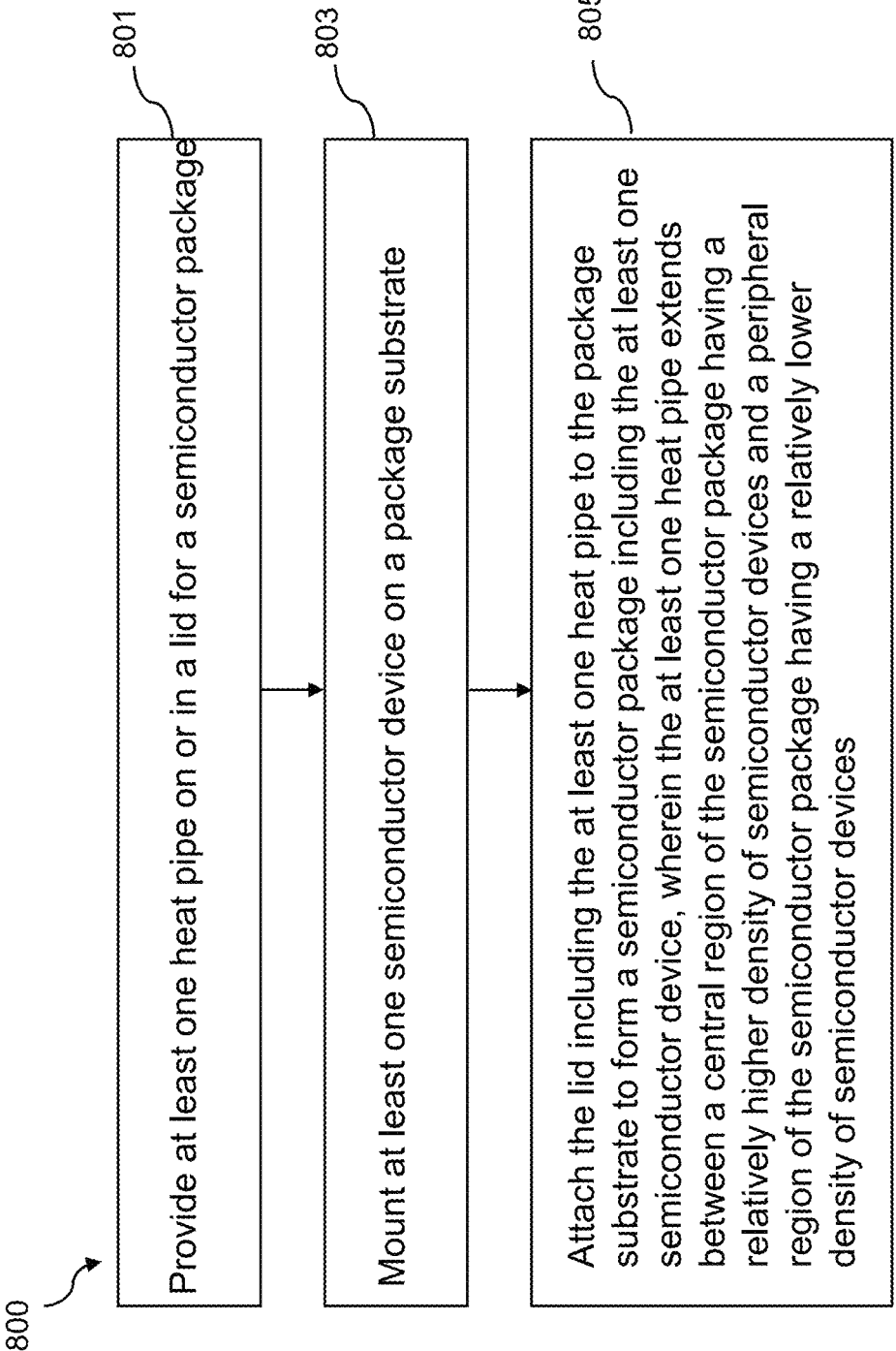

800

801

Provide at least one heat pipe on or in a lid for a semiconductor package

803

Mount at least one semiconductor device on a package substrate

805

Attach the lid including the at least one heat pipe to the package substrate to form a semiconductor package including the at least one semiconductor device, wherein the at least one heat pipe extends between a central region of the semiconductor package having a relatively higher density of semiconductor devices and a peripheral region of the semiconductor package having a relatively lower density of semiconductor devices

FIG. 8

SEMICONDUCTOR PACKAGE INCLUDING LID WITH INTEGRATED HEAT PIPE FOR THERMAL MANAGEMENT AND METHODS FOR FORMING THE SAME

RELATED APPLICATION

This application is a divisional application of U.S. patent application Ser. No. 17/407,224 entitled "Semiconductor Package Including Lid with Integrated Heat Pipe for Thermal Management and Methods for Forming the Same," filed on Aug. 20, 2021, the entire contents of which is hereby incorporated by reference for all purposes.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers over a semiconductor substrate, and patterning the various material layers using lithography and etch to form circuit components and elements thereon. Dozens or hundreds of integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example In semiconductor packages, particularly semiconductor packages with relatively higher power utilization, excessive heat generation within the package and poor heat dissipation characteristics can have a number of undesirable effects, including hindered package performance and/or damage to components within the package. There is a continuing need for improvements of semiconductor packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a flow diagram illustrating a method for fabricating a semiconductor package including a lid having one or more heat pipes on or in the lid according to various embodiments of the present disclosure.

DETAILED DESCRIPTION

Figure 1A:
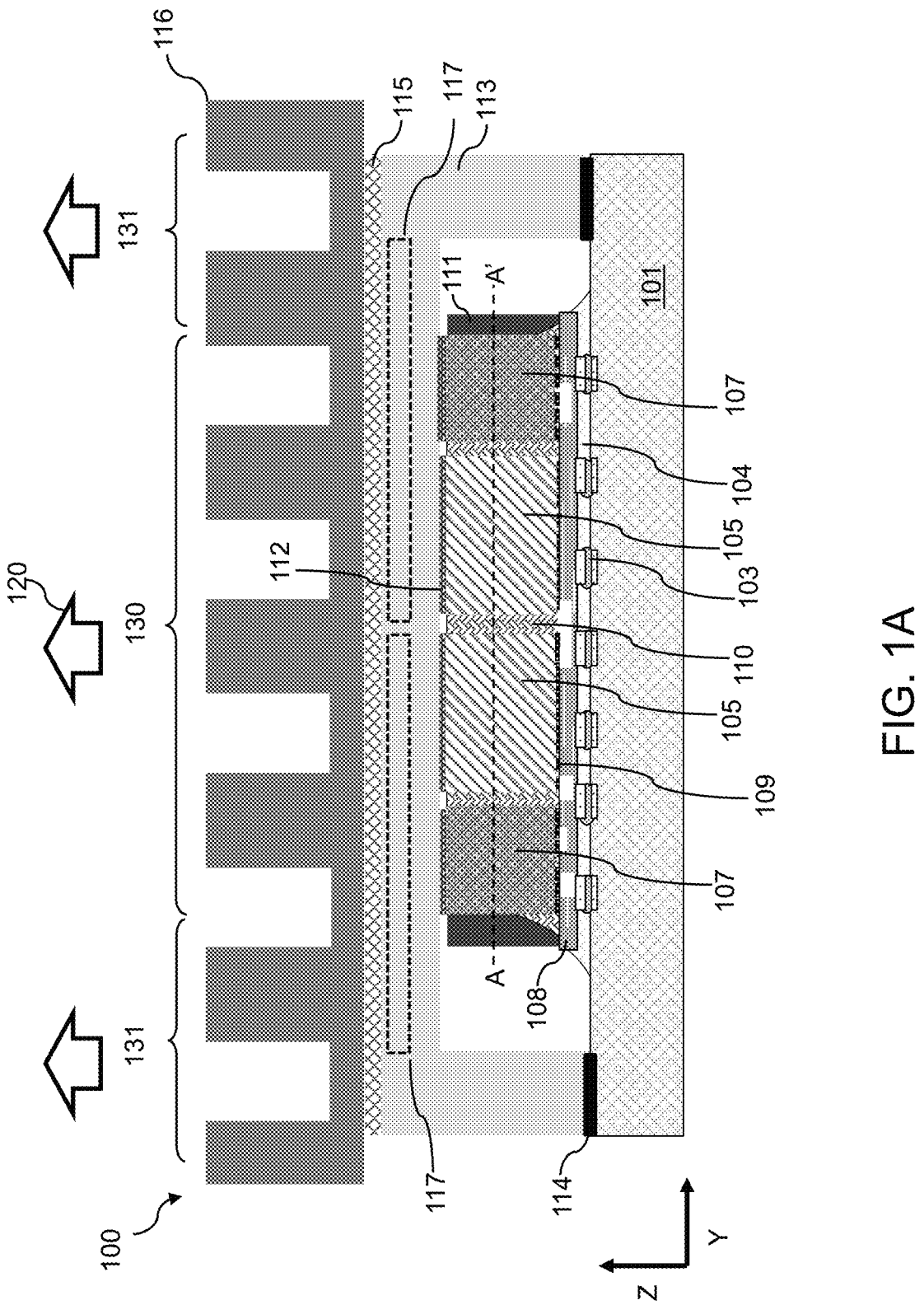
FIG. 1A is a vertical cross-section view of a semiconductor package along line BB' in FIG. 1B according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package, a number of semiconductor integrated circuit (IC) dies (i.e., "chips") may be mounted onto a common substrate. The package typically includes a housing that encloses the IC dies to protect them from damage. The housing may also provide sufficient heat dissipation from the package. In some cases, the package may include a lid composed of a thermally-conductive material (e.g., a metal or metal alloy, such as copper). The lid may be located over the IC dies. Heat energy from the IC dies may be transferred from the upper surfaces of the IC dies into the lid and ultimately dissipated to the environment. The heat energy may optionally be dissipated through a heat sink that may be attached to or may be integrally formed with the lid.

An issue with existing semiconductor packages utilizing a thermally-conductive lid is that the heat flow through the lid is not uniform, which may result in heat accumulation in regions of the package having relatively higher circuit density and/or higher power utilization. In many cases, the highest circuit density and power utilization may be in a central region of the package. To address the issue of heat accumulation, the lid may be formed of a material having very high thermal conductivity, such as copper, in order to improve the spread of heat away from the hotter regions of the package. However, such materials tend to be more expensive and may add additional cost to the semiconductor package.

In order to improve the thermal management in semiconductor packages, various embodiments of the present disclosure include a semiconductor package including a lid having one or more heat pipes located on and/or within the lid. A heat pipe is a type of heat-transfer device that includes a sealed conduit containing a working fluid. A heat pipe may transfer heat using a combination of thermal conduction and phase transition of the working fluid. Heat absorption in a relatively hotter region of the heat pipe may cause a portion of the working fluid to transition from a liquid phase to a vapor phase. The working fluid in vapor phase may flow to a cooler region of the heat pipe, where the working fluid may condense back into liquid phase, thereby releasing the working fluid's latent heat. In various embodiments, one or more heat pipes may be thermally integrated within a lid of a semiconductor package in order to distribute heat from relatively hotter regions of the lid to relatively cooler regions of the lid. The various embodiments may provide more uniform heat dissipation from the semiconductor package, reduce the risk of damage to the package due to excessive heat accumulation, and may enable the lid to be fabricated using less expensive materials, thereby reducing the overall costs of a semiconductor package.

Figure 1B:
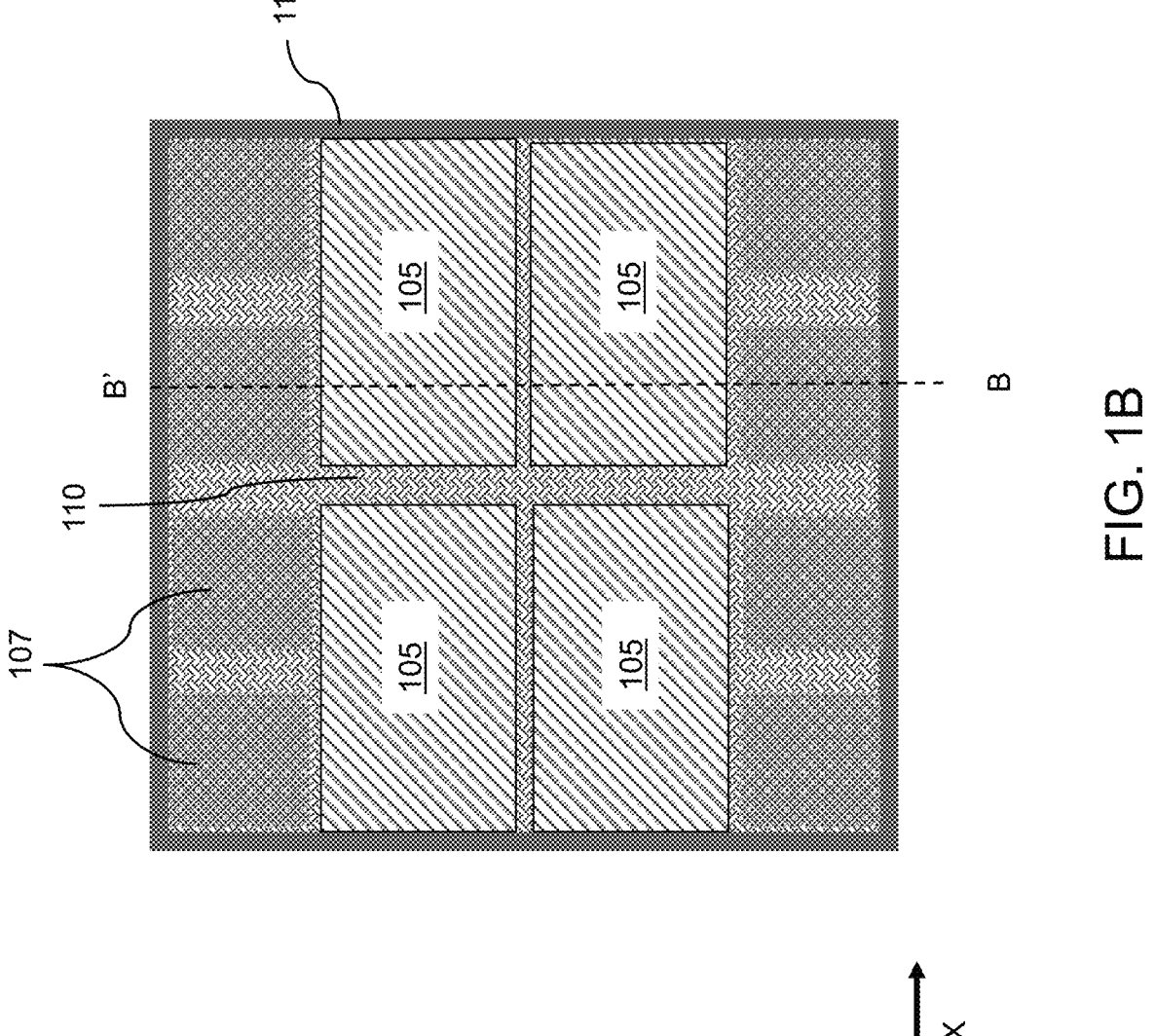
FIG. 1B is a horizontal cross-section view of a semiconductor package along line AA' in FIG. 1A according to various embodiments of the present disclosure.

FIG. 1A is a vertical cross-section view of a semiconductor package 100 according to various embodiments of the present disclosure. FIG. 1B is a horizontal cross-section view of the semiconductor package 100 taken along line A-A' in FIG. 1A. Referring to FIGS. 1A and 1B, the semiconductor package 100 may include one or more integrated circuit (IC) semiconductor devices, such as first IC semiconductor devices 105 and second IC semiconductor devices 107. In various embodiments, the first IC semiconductor devices 105 may be three-dimensional devices, such as three-dimensional integrated circuits (3DICs), System on Chip (SOC) or System on Integrated Circuit (SoIC) devices. A three-dimensional IC semiconductor device 105 may be formed by placing chips over chips on a semiconductor wafer level. These three-dimensional devices may provide improved integration density and other advantages, such as faster speeds and higher bandwidths, due to a decreased length of interconnects between the stacked chips. In some embodiments, a first three-dimensional IC semiconductor device 105 may also be referred to as a "first die stack." In some embodiments, the first IC semiconductor devices 105 may be dies or chips, such as logic dies or power management dies.

In the embodiment shown in FIGS. 1A and 1B, the semiconductor package 100 includes four first die stacks 105, each of which may be a System on Chip (SOC) device. In embodiments, the first die stacks 105 may be adjacent to one another and located in a central portion of the package 100. The package 100 may further include one or more second IC semiconductor devices 107. In some embodiments, the one or more second IC semiconductor devices 107 may be three-dimensional IC semiconductor devices, and may also be referred to as "second die stacks." In some embodiments, the second die stacks 107 may each be a semiconductor memory device, such as a high bandwidth memory (HBM) device. In the embodiment shown in FIGS. 1A and 1B, the semiconductor package 100 includes eight second die stacks 107, each of which may be a HBM device. The second die stacks 107 may be located on a periphery around the first die stacks 105. A molding 111, which may be composed of an epoxy-based material, may be located around the periphery of the first die stacks 105 and the second die stacks 107. Although the embodiment illustrated in FIGS. 1A and 1B show four (4) first die stacks 105 and eight (8) second die stacks 107, greater or lesser die stacks may be included in the package.

Referring again to FIG. 1A, the first die stacks 105 and the second die stacks 107 may be mounted on an interposer 108. In some embodiments, the interposer 108 may be an organic interposer composed of a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer are contemplated within the scope of the disclosure. The interposer 108 may include a plurality of conductive bonding pads on upper and lower surfaces of the interposer 108 and a plurality of conductive interconnects extending through the interposer 108 between the upper and lower bonding pads of the interposer 108. The conductive interconnects may distribute and route electrical signals between IC semiconductor devices (e.g., first die stacks 105 and second die stacks 107) and an underlying package substrate 101. Thus, the interposer 108 may also be referred to as redistribution layers (RDLs). A plurality of metal bumps 109, such as microbumps, may electrically connect conductive bonding pads on the bottom surfaces of the first dies stacks 105 and second die stacks 107 to the conductive bonding pads on the upper surface of the interposer 108. In one non-limiting embodiment, metal bumps 109 in the form of microbumps may include a plurality of first metal stacks, such as a plurality of Cu—Ni—Cu stacks, located on the bottom surfaces of the first die stacks 105 and the second die stacks 107, and a plurality of second metal stacks (e.g., Cu—Ni—Cu stacks) located on the upper surface of the interposer 108. A solder material, such as tin (Sn), may be located between respective first and second metal stacks to electrically connect the first die stacks 105 and the second die stacks 107 to the interposer 108. Other suitable materials for the metal bumps 109 are within the contemplated scope of disclosure.

A first underfill material portion 110 may be provided in the spaces surrounding the metal bumps 109 and between the bottom surfaces of the first and second die stacks 105, 107 and the upper surface of the interposer 108. The first underfill material portion 110 may also be provided in the spaces laterally separating adjacent die stacks (i.e., first die stacks 105 and second die stacks 107) of the semiconductor package 100. Thus, the first underfill material portion 110 may extend over side surfaces of the first die stacks 105 and/or the second die stacks 107, as shown in FIG. 1A. In various embodiments, the first underfill material portion 110 may be composed of an epoxy-based material, which may include a composite of resin and filler materials. Other underfill materials are within the contemplated scope of disclosure.

The interposer 108 may be located on a package substrate 101 that may provide mechanical support for the interposer 108 and the IC semiconductor devices (e.g., first die stacks 105 and second die stacks 107) that are mounted thereon. The package substrate 101 may be composed of a suitable material, such as a semiconductor material (e.g., a semiconductor wafer, such as a silicon wafer), a ceramic material, an organic material (e.g., a polymer and/or thermoplastic material), a glass material, combinations thereof, or the like.

Other suitable substrate materials are within the contemplated scope of invention. In various embodiments, the package substrate 101 may include a plurality of conductive bonding pads in an upper surface of the package substrate 101. A plurality of metal bumps 103, such as C4 solder bumps, may electrically connect conductive bonding pads on the bottom surface of the interposer 108 to the conductive bonding pads on the upper surface of the package substrate 101. In various embodiments, the metal bumps 103 may include a suitable solder material, such as tin (Sn).

A second underfill material portion 104 may be provided in the spaces surrounding the metal bumps 103 and between the bottom surface of the interposer 108 and the upper surface of the package substrate 101. In various embodiments, the second underfill material portion 104 may be composed of an epoxy-based material, which may include a composite of resin and filler materials. The second underfill material portion 104 may be the same material or a different material as the first underfill material portion 110.

A lid 113 may be disposed over the upper surfaces of the IC semiconductor devices (e.g., the first die stacks 105 and the second die stacks 107). The lid 113 may also laterally surround the IC semiconductor devices (e.g., the first die stacks 105 and the second die stacks 107) such that the IC semiconductor devices (105, 107) are fully-enclosed by the combination of the package substrate 101 and the lid 113. The lid 113 may be attached to an upper surface of the package substrate 101 via a suitable adhesive 114. In various embodiments, the adhesive 114 may be a thermally-conductive adhesive, such as an SW4450 adhesive from Dow Chemical Company. Other suitable adhesive materials 114 are within the contemplated scope of disclosure. In some embodiments, the lid 113 may be integrally formed or may include pieces. For example, the lid 113 may include a ring portion surrounding the IC semiconductor devices 105, 107, a cover portion covering the ring portion and the IC semiconductor devices 105, 107, and an adhesive connecting the cover portion to the ring portion.

In some embodiments, a first thermal interface material (TIM) layer 112 may be disposed between an upper surface of each of the IC semiconductor devices (e.g., the first die stacks 105 and the second die stacks 107) and an underside of the lid 113. In various embodiments, the first thermal interface material (TIM) layer 112 may include a gel-type TIM having a relatively high thermal conductivity. Other suitable materials for the first TIM layer 112 are within the contemplated scope of disclosure. In some embodiments, the first TIM layer 112 may include a single TIM piece covering both the first die stacks 105 and the second die stacks 107, or two or more TIM pieces corresponding to each of the first die stacks 105 and the second die stacks 107.

In some embodiments, a heat sink 116 may be provided on an upper surface of the lid 113. The heat sink 116 may include fins or other features that may be configured to increase a surface area between the heat sink 116 and a cooling fluid, such as ambient air. In some embodiments, the heat sink 116 may be a separate component that may be attached to an upper surface of the lid 113. Alternatively, the heat sink 116 may be integrally formed with the lid 113. In embodiments in which the heat sink 116 is a separate component from the lid 113, a second TIM layer 115 may be located between the upper surface of the lid 113 and a bottom surface of the heat sink 116. In various embodiments, the second TIM layer 115 may include a gel-type TIM having a relatively high thermal conductivity. Other suitable materials for the second TIM layer 115 are within the contemplated scope of disclosure. The heat sink 116 may be composed of a suitable thermally-conductive material, such as a metal or metal alloy.

Referring again to FIG. 1A, in various embodiments, one or more heat pipes 117 may be located on or within the lid 113 and may be in thermal contact with the lid 113. A heat pipe 117 is a type of heat-transfer device that includes a sealed conduit containing a working fluid. Heat transfer in a heat pipe 117 may operate by both thermal conduction and phase transition of the working fluid of the heat pipe 117. Thermal conduction through the solid surface of the heat pipe 117 causes a portion of the working fluid to transition from liquid phase to a vapor phase (i.e., gas phase) via heat absorption. The working fluid in vapor phase may then travel along the heat pipe from a relatively hotter region of the heat pipe 117 to a relatively cooler region of the heat pipe 117, where the working fluid may condense back into liquid phase, thereby releasing the working fluid's latent heat. The liquid phase working fluid may then return to the relatively hotter region of the heat pipe 117, such as by capillary action through a wick structure within the heat pipe 117, and the process may be repeated.

In various embodiments, the one or more heat pipes 117 located on or within the lid 113 may extend between a central region 130 of the semiconductor package 100 and a peripheral region 131 of the semiconductor package 100. In various embodiments, a central region 130 of the semiconductor package 100 may be a region of the semiconductor package 100 that includes a relatively higher density of the one or more integrated circuit (IC) semiconductor devices, such as the first die stacks 105 and the second die stacks 107 shown in FIGS. 1A and 1B. A peripheral region 131 of the semiconductor package 100 may be a region of the semiconductor package that has a relatively lower density of integrated circuit (IC) semiconductor devices, including a region that does not include any IC semiconductor devices.

In a semiconductor package 100 including a lid 113 such as shown in FIGS. 1A and 1B, excessive heat accumulation in the semiconductor package 100 may be more likely to occur in the central region 130 of the semiconductor package 100 that includes the highest density of IC semiconductor devices (e.g., the first die stacks 105 and the second die stacks 107) than in the peripheral regions 131 of the semiconductor package 100. This is because the majority of the heat in the semiconductor package 100 is generated by the IC semiconductor device (e.g., 105, 107) in the central region 130 of the semiconductor package 100, and the heat transfer through the lid 113 may occur primarily along the vertical direction (i.e., the direction of the z-axis in FIG. 1A) rather than spreading horizontally through the semiconductor package 100 (i.e., along the x-axis and y-axis directions in FIGS. 1A and 1B). Thus, the portion of the lid 113 overlying the IC semiconductor devices (e.g., 105, 107) in the central region 130 of the semiconductor package 100 is generally the hottest portion of the lid 113. The concentration of heat generating elements and the hottest portion of the lid 113 being located in the central region may result in overheating and damage to the semiconductor package 100 if the rate of heat loss from the central region 130 of the semiconductor package 100 is not sufficiently high. In practice, this means that the lid 113 may be typically composed of a material having a very high thermal conductivity, such as copper (Cu), which has a thermal conductivity of about 398 W/m·K. However, such high-thermal conductivity materials are typically relatively expensive, which may increase the costs of the semiconductor package 100.

According to various embodiments of the present disclosure, a lid 113 for a semiconductor package 100 that includes one or more heat pipes 117 thermally integrated with the lid 113 may aid in dissipating heat along a horizontal direction, such as from a central region 130 of the semiconductor package 100 to peripheral region(s) 131 of the semiconductor package 100. This may provide a more uniform heat dissipation from the semiconductor package 100, as is schematically illustrated by arrows 120 in FIG. 1A, and may greatly reduce the risk of overheating and thermally-induced damage in the semiconductor package 100. In addition, by providing a lid 113 for a semiconductor package 100 that includes one or more heat pipes 117 thermally integrated with the lid 113, the lid 113 may be fabricated using materials having a relatively lower thermal conductivity, such as aluminum (Al), which may be cheaper than the high thermal conductivity materials typically used for fabricating lids 113, thereby reducing the cost of the semiconductor package 100.

Figure 2A:
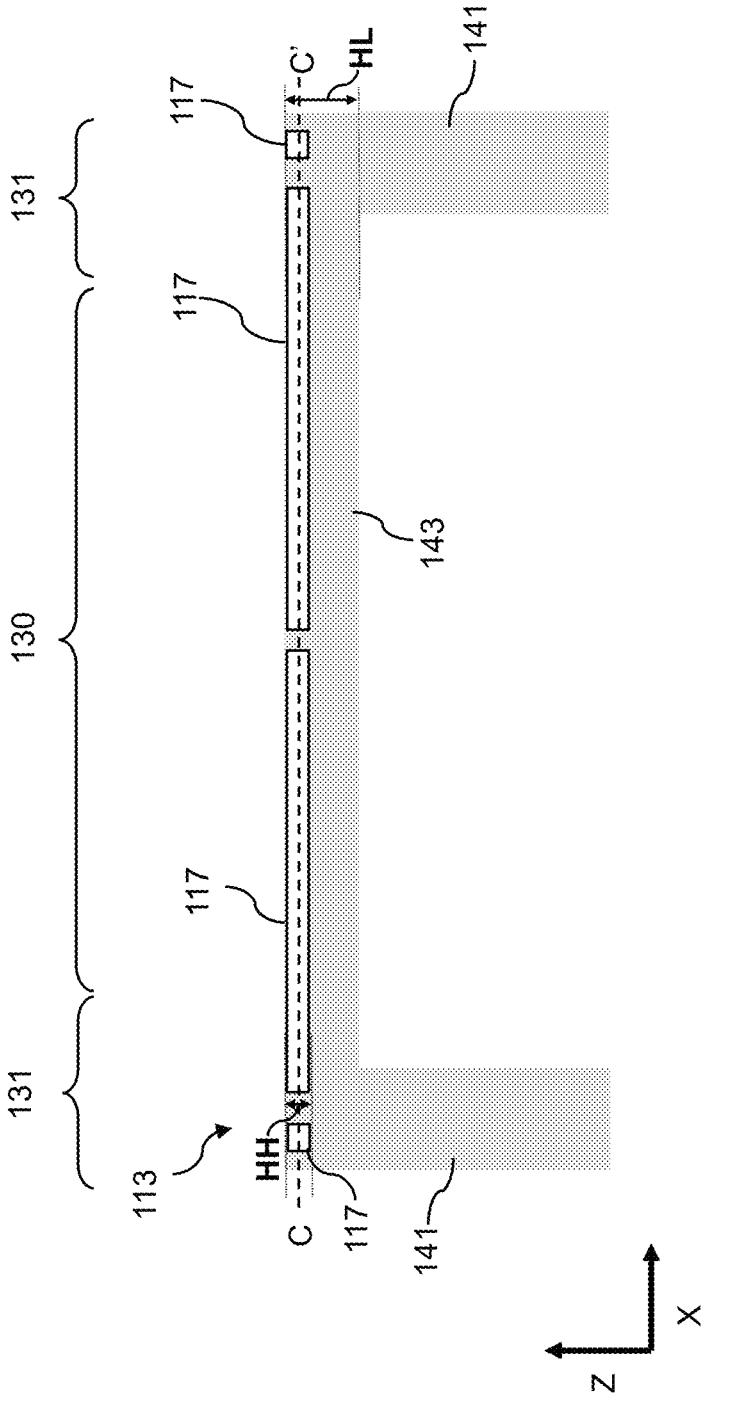
FIG. 2A is a vertical cross-section view of a lid for a semiconductor package including a plurality of heat pipes according to an embodiment of the present disclosure.
Figure 2B:
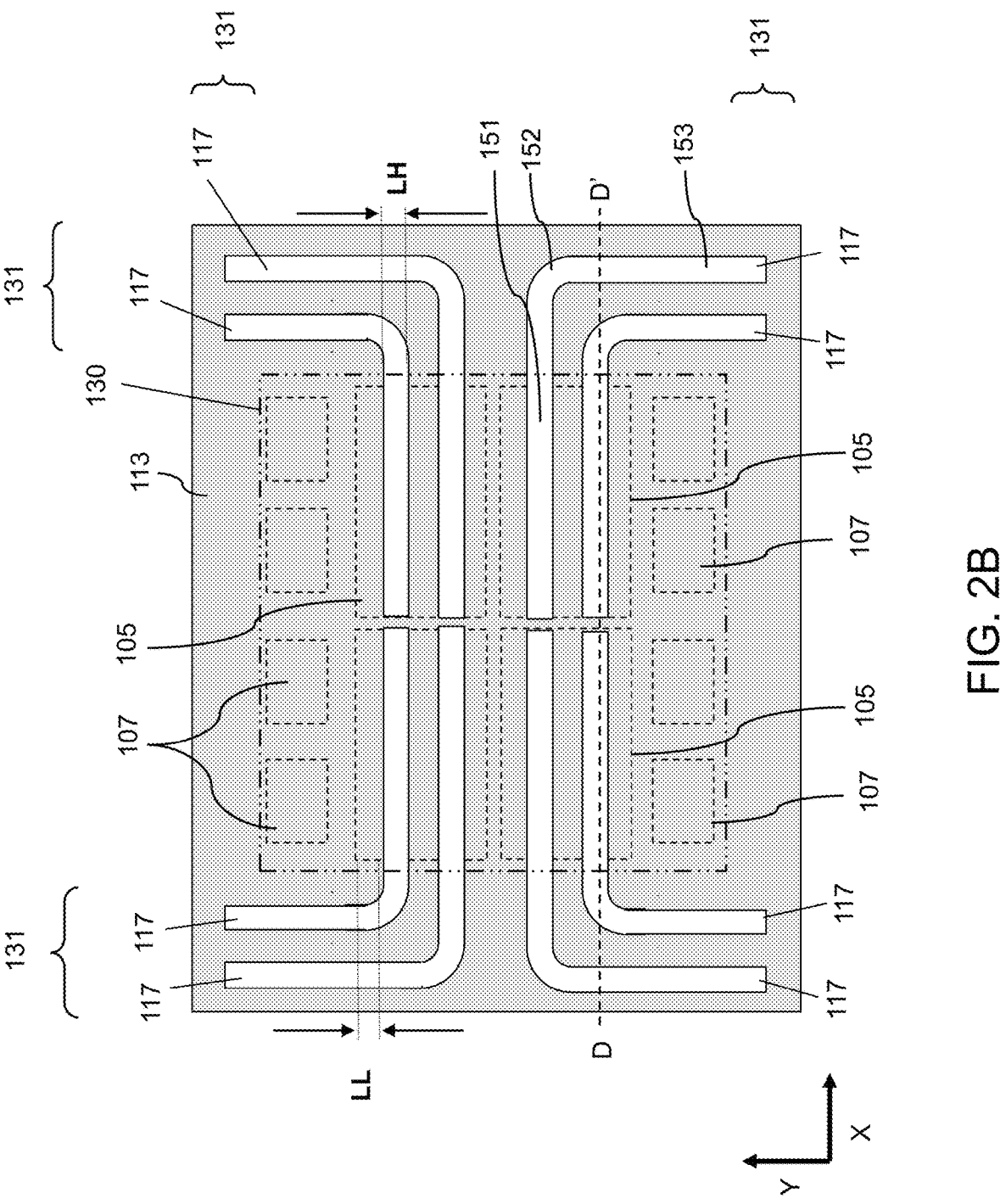
FIG. 2B is a horizontal cross-section view of a lid for a semiconductor package including a plurality of heat pipes according to an embodiment of the present disclosure.

FIG. 2A is a vertical cross-section view of a lid 113 for a semiconductor package 100 including a plurality of heat pipes 117 along line DD' in FIG. 2B according to an embodiment of the present disclosure. FIG. 2B is a horizontal cross-section view of the lid 113 taken along line CC' in FIG. 2A. Referring to FIG. 2A, the lid 113 may include at least one sidewall portion 141 that may be mounted to an upper surface of a package substrate and may laterally surround the one or more IC semiconductor devices of a semiconductor package 100 as shown in FIG. 1A. An upper portion 143 of the lid 113 may extend between the sidewall portion(s) 141 and over the upper surfaces of the IC semiconductor device(s) 105, 107.

Referring to FIGS. 2A and 2B, the lid 113 may include at least one heat pipe 117 located on or in the lid 113. In various embodiments, the lid 113 may include at least two heat pipes 117. The lid 113 in the embodiment shown in FIGS. 2A and 2B includes eight (8) heat pipes 117 that may be located in the upper portion 143 of the lid 113. In some embodiments, such as shown in FIG. 2A, the upper surfaces of the heat pipes 117 do not extend above a horizontal plane defined by the upper surface of the upper portion 143 of the lid 113. In some embodiments, the heat pipes 117 may be fully embedded within the upper portion 143 of the lid 113, such that the heat pipes 117 may be surrounded on all sides by the lid 113. In other embodiments, the heat pipes 117 may be located within slots or grooves that may be formed in the upper surface of the upper portion 143 of the lid 113. In some embodiments, the upper surfaces of the heat pipes 117 may project above the horizontal plane defined by the upper surface of the upper portion 143 of the lid 113.

The heat pipes 117 may be integrally formed with the lid 113 or may be separate components that may be mounted to or within the lid 113. Each heat pipe 117 may include an outer wall surrounding an interior conduit that contains a working fluid. The outer walls of the heat pipes 117 may have any suitable cross-sectional shape, such as circular, rectangular, stretched-circular, ovoid, elliptical, triangular, and the like. Other suitable cross-sectional shapes are within the contemplated scope of disclosure. The outer walls of the heat pipes 117 may be composed of material(s) having a relatively high thermal conductivity, such as a metal, a metal alloy or a ceramic material. Suitable materials for the outer walls of the heat pipes 117 include copper (Cu), aluminum (Al), molybdenum (Mo), gold (Au), silver (Ag), nickel (Ni), silicon carbide (SiC), beryllium oxide (BeO), titanium (Ti), tungsten (W), zinc (Zn), graphite, alloys thereof, and combinations of the same. Other suitable materials for the outer walls of the heat pipes 117 are within the contemplated scope of disclosure.

In some embodiments, the outer walls of the heat pipes 117 may be composed of the same material(s) as the lid 113. Alternatively, the outer walls of the heat pipes 117 may be composed of a different material than the lid 113. In some embodiments, the lid 113 may be composed of a material having a thermal conductivity that may be less than 398 W/m·K. In one non-limiting embodiment, the outer walls of the heat pipes 117 may be composed of copper (Cu) and the lid 113 may be composed of aluminum (Al).

Referring again to FIG. 2A, the upper portion 143 of the lid 113 may have a thickness, HL, along the z-axis direction and each of the heat pipes 117 may have a height dimension, HH, along the z-axis direction. In various embodiments, the height dimension, HH, of the heat pipes 117 may be at least 10% of the thickness, HL, of the upper portion 143 of the lid 113 (i.e., $HH \geq 0.1 * HL$), which may provide good heat transfer capability for the heat pipes 117.

FIG. 2B illustrates the locations of IC semiconductor devices, including first die stacks 105 and second die stacks 107, in the assembled semiconductor package 100 are shown as dashed lines. In this exemplary embodiment, the first die stacks 105, which may be System on Chip (SOC) devices, are located in a central portion of the semiconductor package 100, and second die stacks 107, which may be high-bandwidth memory (HBM) devices, are located laterally adjacent to the first die stacks 105 along the y-axis direction. In the embodiment shown in FIGS. 2A and 2B, each of the heat pipes 117 extends between the central region 130 of the semiconductor package 100 overlying the IC semiconductor devices 105, 107 and a peripheral region 131 of the semiconductor package 100. The peripheral region 131 in the embodiment of FIGS. 2A and 2B does not include any IC semiconductor devices 105, 107.

Referring to FIG. 2B, each heat pipe 117 may include a first straight segment 151 that extends in the central region 130 of the semiconductor package 100, a second straight segment 153 that extends in the peripheral region 131 of the semiconductor package 100, and a curved or bent portion 152 between the first straight segment 151 and the second straight segment 153. The first straight segment 151 may extend along a first direction (i.e., the x-axis direction in FIG. 2B) and the second straight segment 153 may extend along a second direction (i.e., the y-axis direction in FIG. 2B) that may be orthogonal to the first direction. In the exemplary embodiment shown in FIG. 2B, each first straight segment 151 of the respective heat pipes 117 may be located over a first die stack 105 (e.g., a SOC device) in the assembled semiconductor package 100. In particular, at least two heat pipes 117 may be located over each of the first die stacks 105. An offset distance between the peripheral edge of each first die stack 105 and the peripheral edge of the heat pipe 117 overlying the first die stack 105 that is most proximate to the peripheral edge of the first die stack 105 may be defined as LL. In various embodiments, a width dimension, LH, of each of the heat pipes 117 is equal to or greater than the offset distance, LL, and may be up to five (5) times as great as the offset distance, LL (i.e., $LL \leq LH \leq 5 * LL$), which may provide good heat transfer capability for the heat pipes 117.

Figure 3:
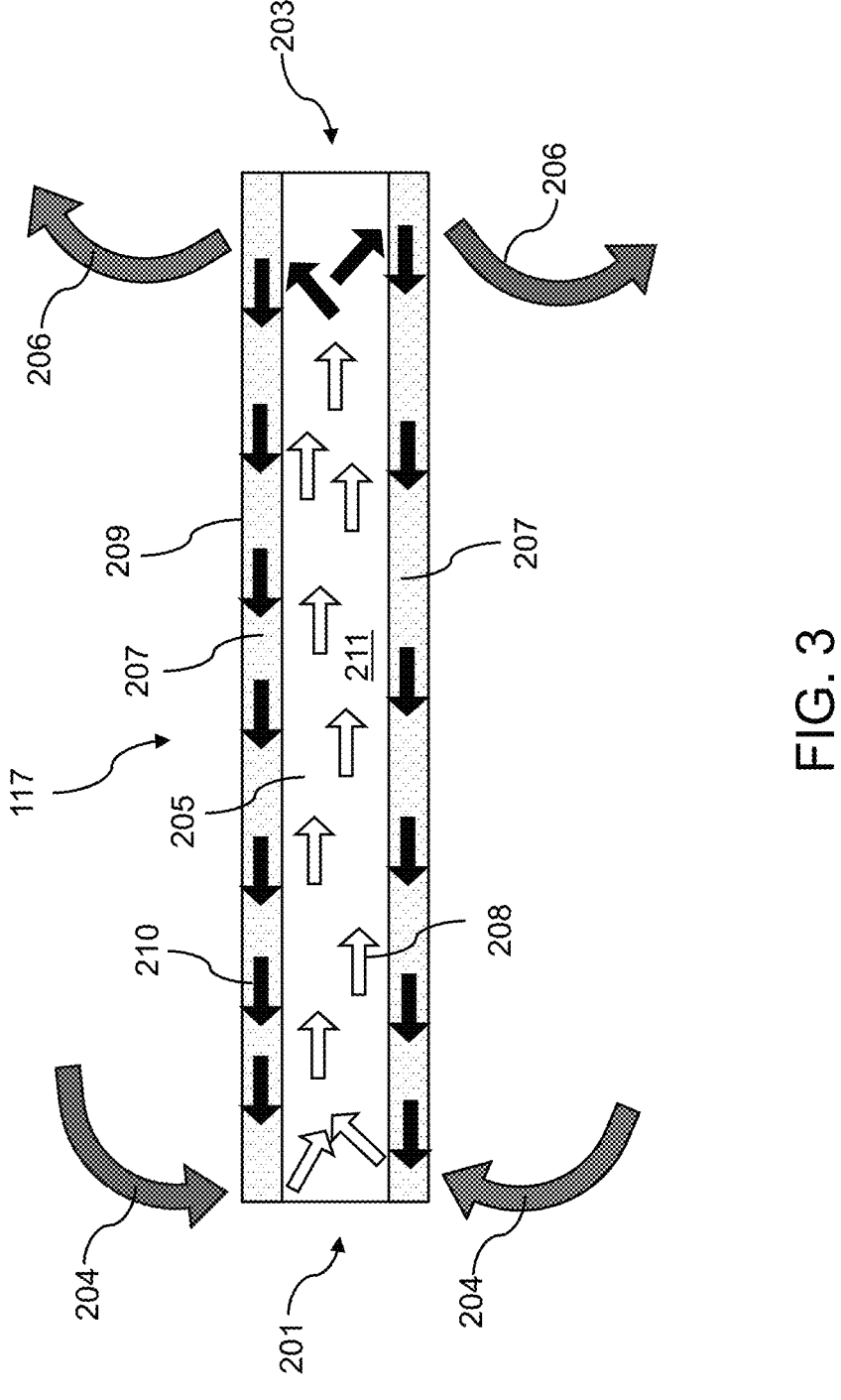
FIG. 3 is a schematic cross-section view of a heat pipe according to various embodiments of the present disclosure.

FIG. 3 is a schematic cross-section view of a heat pipe 117 according to various embodiments of the present disclosure. Referring to FIG. 3, the heat pipe 117 may include an outer wall 209 that encloses a central fluid conduit 211 that extends between a first end 201 and a second end 203 of the heat pipe 117. The interior of the heat pipe 117 may be hermetically sealed from the outside environment. The heat pipe 117 may also include a wick structure 207 that may extend between the first end 201 and the second end 203 of the heat pipe 117. In various embodiments, the wick structure 207 may be located between the central fluid conduit 211 and the outer wall 209 of the heat pipe 117. The heat pipe 117 may be partially filled with a working fluid 205, such as water, ethanol, methanol, ammonia, combinations of the same, or any suitable materials. Other suitable working fluids for the heat pipe 117 are within the contemplated scope of disclosure. The mass of the working fluid 205 may be selected so that the heat pipe 117 contains working fluid in both the liquid phase and the vapor phase over the operating temperature range of the heat pipe 117.

Referring again to FIG. 3, the first end 201 of the heat pipe 117 may be located in a higher-temperature region of the semiconductor package 100, such as the central region 130 of the semiconductor package 100 as illustrated in FIGS. 1A, 2A and 2B. The second end 203 of the heat pipe 117 may be located in a lower-temperature region of the semiconductor package 100, such as the peripheral region of the semiconductor package 100 as illustrated in FIGS. 1A, 2A and 2B. Heat energy, schematically illustrated by arrows 204, may be transferred to the heat pipe 117 from the lid 113 (not shown in FIG. 3) and may be conducted through the outer wall 209 of the heat pipe 117. The heat energy 204 may then be absorbed by the working fluid 205, causing a portion of the working fluid 205 to transition from liquid phase (indicated by the dark arrows 210) to a vapor phase (indicated by the light arrows 208). The working fluid 205 in vapor phase 208 may then travel through the central conduit 211 between the first end 201 and the second end 203 of the heat pipe 117. As the working fluid 205 approaches the relatively cooler second end 203 of the heat pipe 117, the working fluid 205 may condense back into the liquid phase (indicated by dark arrows 210), thereby releasing its latent heat. The heat released by the working fluid 205 may be transferred through the outer wall 209 of the heat pipe 117 and into the surrounding structure(s) of the semiconductor package 100 (e.g., the lid 113, the second thermal interface layer 115, and/or the heat sink 116 as shown in FIG. 1A) as indicated by arrows 206 in FIG. 3.

The wick structure 207 of the heat pipe 117 may be a structure that exerts a capillary action on the working fluid in liquid phase 210. For example, the wick structure 207 may include a sintered metal powder, a screen, and/or a series of grooves running parallel to the main axis of the heat pipe 117. The wick structure 207 may be composed of one or more materials having relatively high thermal conductivity, such as nickel, titanium, copper, alloys thereof and combinations of the same. Other suitable wick structures and materials for the wick structure are within the contemplated scope of disclosure. The capillary action exerted by the wick structure 207 may cause working fluid in liquid phase 210 to travel along the length of the heat pipe 117 towards the relatively hotter first end 201 of the heat pipe 117. As the working fluid 205 in liquid phase 210 approaches the relatively hotter first end 201 of the heat pipe 117, the working fluid may evaporate into vapor phase 208, and the process may be repeated.

Accordingly, a heat pipe 117 located on or in a lid 113 for a semiconductor package 100 may transfer heat through the working fluid 205 of the heat pipe 117 from a relatively hotter region of the semiconductor package 100 (e.g., a central region 130 of the semiconductor package 100 including a highest density of IC semiconductor devices) to a cooler region of the semiconductor package 100 (e.g., a peripheral region 131 of the semiconductor package 100 including a lower density of IC semiconductor devices). By providing one or more heat pipes 117 on or in the lid 113 of the semiconductor package 100, where the heat pipes 117 extend between a hotter region and a cooler region of the semiconductor package 100, heat transfer along a horizontal direction may be improved, which may result in a more uniform heat loss over different areas of the semiconductor package 100.

Figures 4, 5:
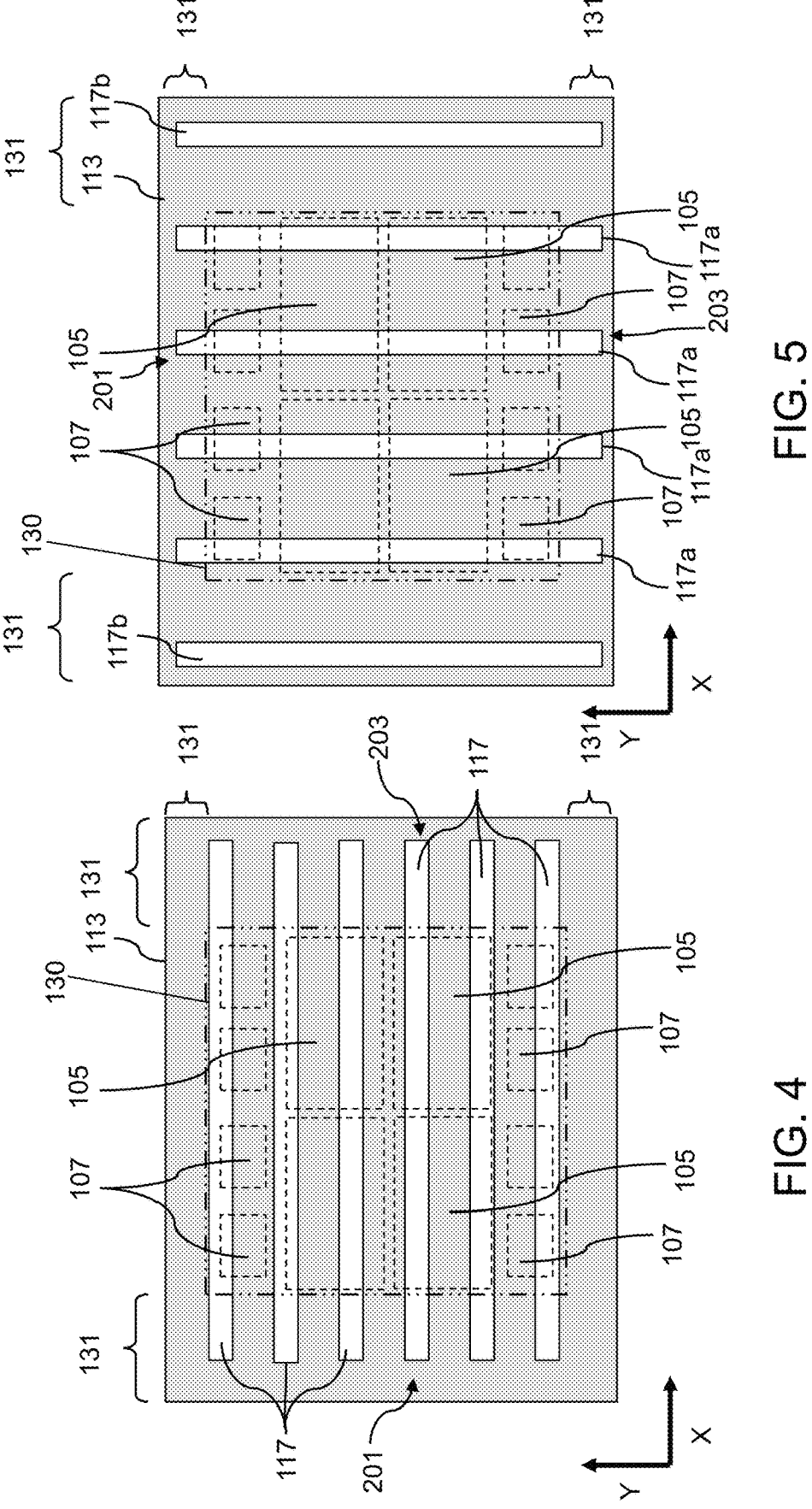
FIG. 4 is a horizontal cross-section view of a lid for a semiconductor package including a plurality of heat pipes according to another embodiment of the present disclosure.
FIG. 5 is a horizontal cross-section view of a lid for a semiconductor package including a plurality of heat pipes according to another embodiment of the present disclosure.

FIG. 4 is a horizontal cross-section view of a lid 113 for a semiconductor package 100 including a plurality of heat pipes 117 according to another embodiment of the present disclosure. Referring to FIG. 4, the lid 113 in this embodiment includes a plurality of heat pipes 117 extending parallel to one another along a first direction (i.e., along the x-axis direction). Each of the heat pipes 117 may extend from the peripheral region 131 on a first side of the semiconductor package 100, through the central region 130 of the semiconductor package 100, and into the peripheral region 131 on the opposite side of the semiconductor package 100. Thus, both the first end 201 and the second end 203 of each of the heat pipes 117 may be located in a peripheral region 131 of the semiconductor package 100. Heat from the central region 130 of the semiconductor package 100 that contains the highest density of IC semiconductor devices 105, 107 may be transferred to the working fluid of the heat pipes 117, which may transfer the heat along the x-axis direction to both the first end 201 and the second end 203 of each of the heat pipes 117, which are each located in the peripheral region 131 of the semiconductor package 100.

Referring again to FIG. 4, the locations of IC semiconductor devices, including first die stacks 105 and second die stacks 107, in the assembled semiconductor package 100 are shown as dashed lines. As in the embodiment shown in FIG. 2A, the first die stacks 105, which may be System on Chip (SOC) devices, are located in a middle portion of the semiconductor package 100 and second die stacks 107, which may be high-bandwidth memory (HBM) devices, are located laterally adjacent to the first die stacks 105 along the y-axis direction. In the embodiment shown in FIGS. 2A and 2B, each of the heat pipes 117 extends over at least one IC semiconductor device of the semiconductor package 100. In one non-limiting embodiment, at least two heat pipes 117 may extend over each of the first die stacks 105 (e.g., SOC devices), and at least one heat pipe 117 may extend over each of the second die stacks 107 (e.g., HBM devices).

FIG. 5 is a horizontal cross-section view of a lid 113 for a semiconductor package 100 including a plurality of heat pipes 117 according to yet another embodiment of the present disclosure. Referring to FIG. 5, the lid 113 in this embodiment includes a plurality of heat pipes 117a, 117b extending parallel to one another along the y-axis direction. A first plurality of heat pipes 117a may extend from the peripheral region 131 on a first side of the semiconductor package 100, through the central region 130 of the semiconductor package 100, and into the peripheral region 131 on the opposite side of the semiconductor package 100. Thus, heat from the central region 130 may be transferred to the peripheral region 131 at both the first end 201 and the second end 203 of each of the heat pipes 117a. At least two heat pipes 117a may extend over each of the first die stacks 105 (e.g., SOC devices) of the semiconductor package 100, and at least one heat pipe 117a may extend over each of the second die stacks 107 (e.g., HBM devices) of the semiconductor package 100. A second plurality of heat pipes 117b may be located in the peripheral region 131 of the semiconductor package 100. The second plurality of heat pipes 117b may help to spread heat within the peripheral region 131 of the semiconductor package 100.

Figures 6, 7:
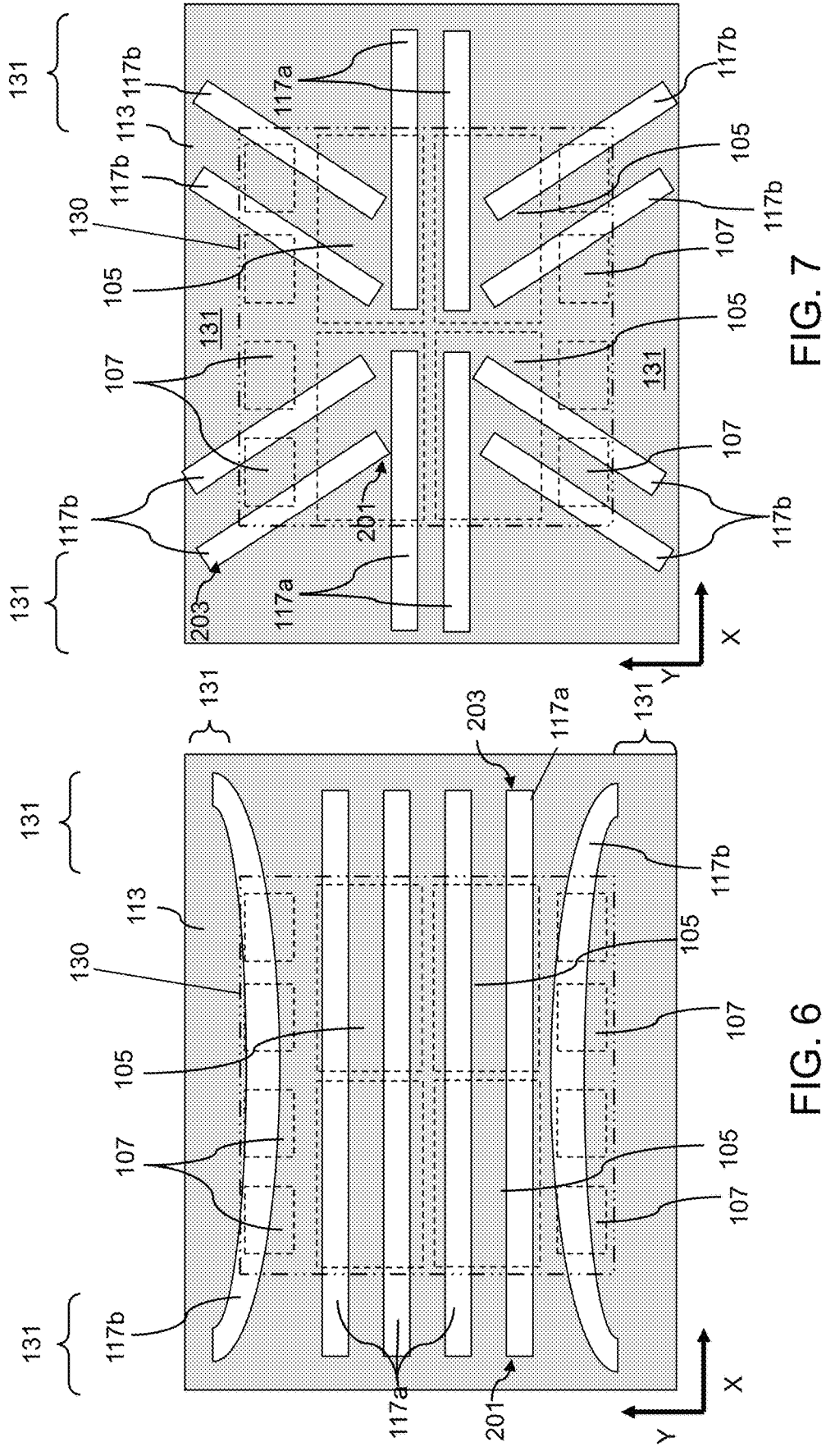
FIG. 6 is a horizontal cross-section view of a lid for a semiconductor package including a plurality of heat pipes according to another embodiment of the present disclosure.
FIG. 7 is a horizontal cross-section view of a lid for a semiconductor package including a plurality of heat pipes according to another embodiment of the present disclosure.

FIG. 6 is a horizontal cross-section view of a lid 113 for a semiconductor package 100 including a plurality of heat pipes 117 according to yet another embodiment of the present disclosure. Referring to FIG. 6, the lid 113 in this embodiment includes a first plurality of heat pipes 117*a* extending parallel to one another along the x-axis direction. Each of the heat pipes 117*a* of the first plurality of heat pipes may extend from the peripheral region 131 on a first side of the semiconductor package 100, through the central region 130 of the semiconductor package 100, and into the peripheral region 131 on the opposite side of the semiconductor package 100. Thus, heat from the central region 130 may be transferred to the peripheral region 131 at both the first end 201 and the second end 203 of each of the heat pipes 117*a*. At least two heat pipes 117*a* of the first plurality of heat pipes may extend over each of the first die stacks 105 (e.g., SOC devices) of the semiconductor package 100.

Referring again to FIG. 6, a second plurality of heat pipes 117*b* may extend along the x-axis direction from the peripheral region 131 on a first side of the semiconductor package 100, through the central region 130 of the semiconductor package 100, and into the peripheral region 131 on the opposite side of the semiconductor package 100. The second plurality of heat pipes 117*b* may differ from the first plurality of heat pipes 117*a* in that each of the heat pipes 117*b* of the second plurality of heat pipes may have a curved or bowed shape in the y-axis direction. Thus, as each of the heat pipes 117*b* extends from the peripheral region 131 on a first side of the semiconductor package 100 into the central region 130 of the semiconductor package 100, the heat pipes 117*b* may curve or bend towards the center of the semiconductor package 100, and as the heat pipes 117*b* extend from the central region 130 of the semiconductor package 100 towards the peripheral region 131 on the opposite side of the semiconductor package 100, the heat pipes 117*b* may curve or bend away from the center of the semiconductor package 100. The heat pipes 117*b* of the second plurality of heat pipes may each extend over at least one second die stack 107 (e.g., an HBM device). In the embodiment shown in FIG. 6, at least one heat pipe 117*b* of the second plurality of heat pipes may extend over each of the second die stacks 107 of the semiconductor package 100.

FIG. 7 is a horizontal cross-section view of a lid 113 for a semiconductor package 100 including a plurality of heat pipes 117 according to yet another embodiment of the present disclosure. Referring to FIG. 7, the lid 113 in this embodiment includes a first plurality of heat pipes 117*a* extending parallel to one another along a first (e.g., x-axis) direction. Each of the heat pipes 117*a* of the first plurality of heat pipes may extend between the central region 130 of the semiconductor package 100 and the peripheral region 131 of the semiconductor package 100. Each of the heat pipes 117*a* of the first plurality of heat pipes may extend over at least one first die stack 105 (e.g., SOC device). In the embodiment shown in FIG. 7, each heat pipe 117*a* of the first plurality of heat pipes extends over a respective first die stack 105 of the semiconductor package 100.

Referring again to FIG. 7, a second plurality of heat pipes 117*b* may each extend in a diagonal direction between the central region 130 and the peripheral region 131 of the semiconductor package 100. Each heat pipe 117*b* of the second plurality of heat pipes may include a first end 201 that is located in the central region 130 and over a first die stack 105 (e.g., a SOC device). The heat pipes 117*b* of the second plurality of heat pipes may each extend from the first end 201 of the respective heat pipes 117*b* in a diagonal direction (i.e., at an oblique angle with respect to the first (e.g., x-axis) direction) away from the center of the semiconductor package 100 and may have a second end 203 located in the peripheral region 131 of the semiconductor package 100. Each of the heat pipes 117*b* of the second plurality of heat pipes may extend over at least one second die stack 107 (e.g., an HBM device). In the embodiment shown in FIG. 7, at least one heat pipe 117*b* of the second plurality of heat pipes extends over each of the second die stacks 107 of the semiconductor package.

FIG. 8 is a flowchart illustrating a method 800 of fabricating a semiconductor package according to one or more embodiments. Referring to FIGS. 1A-8, the method may include a step 801, which includes providing at least one heat pipe 117 on or in a lid 113 for a semiconductor package 100. Referring to FIGS. 1A and 8, the method 800 may further include a step 803, which includes mounting at least one semiconductor device 105, 107 on a package substrate 101. In various embodiments, the at least one semiconductor device 105, 107 may include at least one first die stack, which may be a System on Chip (SOC) device. In various embodiments, the at least one semiconductor device 105, 107 may include at least one second die stack 107, which may be a high bandwidth memory (HBM) device. In some embodiments, the step 803 of mounting the at least one semiconductor device 105, 107 may include mounting the at least one semiconductor device 105, 107 on an interposer 108, and mounting the interposer 108 including the at least one semiconductor device 105, 107 on the package substrate 101. Referring to FIGS. 1A-2B and 4-8, the method may further include a step 805, which may include attaching the lid 113 including the at least one heat pipe 117 to the package substrate 101 to form a semiconductor package 100 including the at least one semiconductor device 105, 107, wherein the at least one heat pipe 117 extends between a central region 130 of the semiconductor package 100 having a relatively higher density of semiconductor devices 105, 107 and a peripheral region 131 of the semiconductor package 100 having a relatively lower density of semiconductor devices 105, 107. In various embodiments, the peripheral region 131 of the semiconductor package 100 may not include any semiconductor devices 105, 107.

Referring to all drawings and according to various embodiments of the present disclosure, a semiconductor package 100 may include a package substrate 101, at least one semiconductor device 105, 107 mounted to the package substrate 101, and a lid 113 attached to the package substrate 101 and extending over the at least one semiconductor device 105, 107, the lid 113 may include at least one heat pipe 117 located on or in the lid 113 and extending between a central region 130 of the semiconductor package 100 including a relatively higher density of semiconductor devices 105, 107 and a peripheral region 131 of the semiconductor package 100 including a relatively lower density of semiconductor devices 105, 107.

In an embodiment, the lid 113 may include a material having a thermal conductivity that is less than 398 W/m·K. In another embodiment, the lid 113 may include aluminum. In another embodiment, the lid 113 may include at least one sidewall portion 141 that laterally surrounds the at least one semiconductor device 105, 107 and an upper portion 143 located over the at least one semiconductor device 105, 107, and wherein the at least one heat pipe 117 may include a height dimension HH that is at least 10% of a thickness HL of the upper portion 143 of the lid 113. In another embodiment, the at least one semiconductor device 105, 107 may include a plurality of die stacks 105, 107. In another embodiment, the plurality of die stacks 105, 107 may include at least one System on Chip (SOC) device 105 and at least one heat pipe 117 located on or in the lid 113 extends over each SOC device 105 of the semiconductor package 100. In another embodiment, at least two heat pipes 117 located on or in the lid 113 may extend over each SOC device 105 of the semiconductor package 100. In another embodiment, a width dimension LH of each heat pipe 117 overlying a respective SOC device 105 may be greater than or equal to, and may be up to five (5) times as great, as an offset distance LL between a peripheral edge of the SOC device 105 and a peripheral edge of the heat pipe 117 overlying the SOC device 105 that is most proximate to the peripheral edge of the SOC device 105. In another embodiment, the plurality of die stacks 105, 107 may further include at least one High Bandwidth Memory (HBM) device 107. In another embodiment, the lid 113 includes a plurality of heat pipes 117 located on or in the lid 113, wherein each heat pipe 117 of the plurality of heat pipes 117 includes a first straight segment 151 extending in the central region 130 of the semiconductor package 100 along a first direction, a second straight segment 153 extending in the peripheral region 131 of the semiconductor package 100 along a second direction that is orthogonal to the first direction, and a curved portion 152 between the first straight segment 151 and the second straight segment 153.

In another embodiment, the lid 113 includes a plurality of heat pipes 117 located on or in the lid 113 extending parallel to one another along a first direction, wherein each heat pipe 117 of the plurality of heat pipes 117 extends from the peripheral region 131 on a first side of the semiconductor package 100 through the central region 130 of the semiconductor package 100 and into the peripheral region 131 on an opposite side of the semiconductor package 100.

In another embodiment, the lid 113 may include one or more additional heat pipes 117*b* that extend along the first direction continuously within the peripheral region 131 of the semiconductor package 100. In another embodiment, the lid 113 may include one or more additional heat pipes 117*b* that extend along the first direction, wherein each of the additional heat pipes 117*b* has a curved shape that bends towards the center of the semiconductor package 100 as the additional heat pipe extends from the peripheral region 131 on the first side of the semiconductor package 100 into the central region 130 of the semiconductor package 100, and bends away from the center of the semiconductor package 100 as the additional heat pipe 117*b* extends from the central region 130 of the semiconductor package 100 into the peripheral region 131 on an opposite side of the semiconductor package 100.

In another embodiment, the lid 113 may include a first plurality of heat pipes 117*a* located on or in the lid 113 extending parallel to one another along a first direction, and a second plurality of heat pipes 117*b* located on or in the lid 113 that extend at an oblique angle with respect to the first direction, wherein each of the first plurality of heat pipes 117*a* and the second plurality of heat pipes 117*b* may include a first end 201 located in the central region 130 of the semiconductor package 100 and a second end 203 located in the peripheral region 131 of the semiconductor package 100.

In another embodiment, the semiconductor package 100 may further include an interposer 108 mounted to the package substrate 100, the at least one semiconductor device 105, 107 mounted to the interposer 108, a first thermal interface material layer 112 located between an upper surface of the at least one semiconductor device 105, 107 and a bottom surface of the lid 113, a heat sink 116 located over the upper surface of the lid 113 and the at least one heat pipe

117, and a second thermal interface layer 115 located between the upper surface of the lid 113 and the at least one heat pipe 117 and a bottom surface of the heat sink 116.

Referring to all drawings, an additional embodiment is drawn to a lid 113 for a semiconductor package 100 that may include at least one sidewall portion 143 configured to laterally surround at least one semiconductor device 105, 107 that may be mounted on a package substrate 101, an upper portion 143 configured to extend from the at least one sidewall portion 141 over an upper surface of the at least one semiconductor device 105, 107, and a plurality of heat pipes 117 contacting and thermally-integrated with the upper portion 143 of the lid 113 and configured to spread heat within the upper portion 143 of the lid 143.

In an embodiment, each of the heat pipes 117 may include an outer wall 209 enclosing a central fluid conduit 211, a working fluid 208, 210 enclosed within the heat pipe 117, wherein a first portion of the working fluid 208, 210 is in a liquid phase 210 and a second portion of the working fluid is in a gas phase 208 at an operating temperature of the semiconductor package 100, and a wick structure 207 configured to exert a capillary action on the working fluid that is in a liquid phase 210. In another embodiment, the outer wall of the heat pipe 117 may include copper, and the upper portion 143 of the lid may include a material having a thermal conductivity that is less than 398 W/m·K.

An additional embodiment is drawn to a method of fabricating a semiconductor package 100 that may include providing at least one heat pipe 117 on or in a lid 113 for a semiconductor package 100, mounting at least one semiconductor device 105, 107 on a package substrate 101, and attaching the lid 113 including the at least one heat pipe 117 to the package substrate 101 to form a semiconductor package 100 including the at least one semiconductor device 105, 107, wherein the at least one heat pipe 117 extends between a central region 130 of the semiconductor package 100 having a relatively higher density of semiconductor devices 105, 107 and a peripheral region 131 of the semiconductor package 100 having a relatively lower density of semiconductor devices 105, 107.

In an embodiment, mounting at least one semiconductor device 105, 107 on a package substrate 101 may include mounting a plurality of semiconductor devices 105, 107 on an interposer 108, and mounting the interposer 108 on the package substrate 101, and wherein the peripheral region 131 of the semiconductor package 100 does not include any semiconductor devices 105, 107.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor package, comprising:

providing at least one heat pipe on or in a lid for a semiconductor package, wherein the at least one heat pipe comprises a working fluid that is fully sealed within an interior of the heat pipe;

mounting at least one semiconductor device on a package substrate; and attaching the lid including the at least one heat pipe to the package substrate to form a semiconductor package including the at least one semiconductor device, wherein the at least one heat pipe extends between a central region of the semiconductor package having a relatively higher density of semiconductor devices and a peripheral region of the semiconductor package having a relatively lower density of semiconductor devices.

2. The method of claim 1, wherein mounting at least one semiconductor device on a package substrate comprises mounting a plurality of semiconductor devices on an interposer, and mounting the interposer on the package substrate, and wherein the peripheral region of the semiconductor package does not include any semiconductor devices.

3. The method of claim 2, wherein attaching the lid including the at least one heat pipe to the package substrate comprises attaching at least one sidewall portion of the lid to the package substrate such that the at least one sidewall portion laterally surrounds the interposer and the plurality of semiconductor devices and an upper portion of the lid is located over the plurality of semiconductor devices, and wherein the at least one heat pipe includes a height dimension that is at least 10% of a thickness of the upper portion of the lid.

4. The method of claim 2, wherein the plurality of semiconductor devices mounted on the interposer comprises a plurality of die stacks.

5. The method of claim 4, wherein the plurality of die stacks comprises at least one System on Chip (SOC) device, and attaching the lid including the at least one heat pipe to the package substrate comprises attaching the lid to the package substrate such that at least one heat pipe located on or in the lid extends over each SOC device.

6. The method of claim 5, wherein attaching the lid including the at least one heat pipe to the package substrate comprises attaching the lid to the package substrate such that at least two heat pipes located on or in the lid extend over each SOC device.

7. The method of claim 5, wherein attaching the lid including the at least one heat pipe to the package substrate comprises attaching the lid to the package substrate such that a width dimension of each heat pipe overlying a respective SOC device is greater than or equal to, and is up to five (5) times as great, as an offset distance between a peripheral edge of the SOC device and a peripheral edge of the heat pipe overlying the SOC device that is most proximate to the peripheral edge of the SOC device.

8. The method of claim 5, wherein the plurality of die stacks further comprises at least one High Bandwidth Memory (HBM) device.

9. The method of claim 5, wherein the lid includes a plurality of heat pipes located on or in the lid, and wherein attaching the lid including the plurality of heat pipes to the package substrate comprises attaching the lid such that each heat pipe of the plurality of heat pipes includes a first straight segment extending in the central region of the semiconductor package along a first direction, a second straight segment extending in the peripheral region of the semiconductor package along a second direction that is orthogonal to the first direction, and a curved portion between the first straight segment and the second straight segment.

10. The method of claim 5, wherein the lid includes a plurality of heat pipes located on or in the lid, and wherein attaching the lid including the plurality of heat pipes to the package substrate comprises attaching the lid such that a plurality of heat pipes located on or in the lid extend parallel to one another along a first direction, wherein each heat pipe of the plurality of heat pipes extends from the peripheral region on a first side of the semiconductor package through the central region of the semiconductor package and into the peripheral region on an opposite side of the semiconductor package.

11. The method of claim 10, wherein attaching the lid including the plurality of heat pipes to the package substrate comprises attaching the lid such that one or more additional heat pipes extend along the first direction continuously within the peripheral region of the semiconductor package.

12. The method of claim 10, wherein attaching the lid including the plurality of heat pipes to the package substrate comprises attaching the lid such that that one or more additional heat pipes extend along the first direction, wherein each of the additional heat pipes has a curved shape that bends towards a center of the semiconductor package as the additional heat pipe extends from the peripheral region on the first side of the semiconductor package into the central region of the semiconductor package, and bends away from the center of the semiconductor package as the additional heat pipe extends from the central region of the semiconductor package into the peripheral region on an opposite side of the semiconductor package.

13. The method of claim 5, wherein the lid includes a plurality of heat pipes located on or in the lid, and wherein attaching the lid including the plurality of heat pipes to the package substrate comprises attaching the lid such that a first plurality of heat pipes located on or in the lid extend parallel to one another along a first direction, and a second plurality of heat pipes located on or in the lid that extend at an oblique angle with respect to the first direction, wherein each of the first plurality of heat pipes and the second plurality of heat pipes includes a first end located in the central region of the semiconductor package and a second end located in the peripheral region of the semiconductor package.

14. The method of claim 1, wherein the lid comprises a material having a thermal conductivity that is less than 398 W/m·K.

15. The method of claim 1, further comprising:

providing a first thermal interface material layer between an upper surface of the at least one semiconductor device and a bottom surface of the lid;

providing a heat sink over the upper surface of the lid and the at least one heat pipe; and providing a second thermal interface layer between the upper surface of the lid and the at least one heat pipe and a bottom surface of the heat sink.

16. A method of fabricating a semiconductor package, comprising:

providing a plurality of heat pipes on or in a lid for a semiconductor package;

mounting at least one semiconductor device on a package substrate; and attaching the lid including the at least one heat pipe to the package substrate such that a sidewall portion of the lid laterally surrounds the at least one semiconductor device mounted on the package substrate and an upper portion of the lid extends from the at least one sidewall portion over an upper surface of the at least one semiconductor device, wherein the plurality of heat pipes contact the upper portion of the lid and are configured spread heat within the upper portion of the lid, wherein each of the plurality of heat pipes on or in the lid comprises an outer wall enclosing a central fluid conduit, a working fluid enclosed within each of the plurality of heat pipes, wherein a first portion of the working fluid is in a liquid phase and a second portion of the working fluid is in a gas phase at an operating temperature of the semiconductor package, and a wick structure configured to exert a capillary action on the working fluid that is in a liquid phase.

17. The method of claim 16, wherein the outer wall of each of the plurality of heat pipes comprises copper, and the upper portion of the lid comprises a material having a thermal conductivity that is less than 398 W/m·K.

18. A method of fabricating a semiconductor package, comprising:

providing at least one heat pipe comprising an interior conduit, a working fluid, and a wick structure on or in a lid for a semiconductor package;

mounting at least one semiconductor device on a package substrate; and attaching the lid including the at least one heat pipe to the package substrate such that an upper portion of the lid and at least a portion of the at least one heat pipe extends over the at least one semiconductor device mounted on the package substrate, and the at least one heat pipe has a height dimension that is at least 10% of a thickness of the upper portion of the lid.

19. The method of claim 18, wherein the upper portion of the lid comprises a material having a thermal conductivity that is less than 398 W/m·K.

20. The method of claim 1, wherein the interior of the at least one heat pipe further comprises a wick structure.

* * * * *